(12) United States Patent
Gao

(10) Patent No.: US 8,981,482 B2
(45) Date of Patent: Mar. 17, 2015

(54) ESD PROTECTION STRUCTURE

(75) Inventor: Xiang Gao, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 62 days.

(21) Appl. No.: 13/241,079

(22) Filed: Sep. 22, 2011

(65) Prior Publication Data

US 2012/0074497 A1 Mar. 29, 2012

(30) Foreign Application Priority Data

Sep. 25, 2010 (CN) .......................... 2010 1 0290452

(51) Int. Cl.
| | | |
|---|---|---|
| *H01L 29/772* | (2006.01) | |
| *H01L 27/02* | (2006.01) | |
| *H01L 29/08* | (2006.01) | |
| *H01L 29/10* | (2006.01) | |
| *H01L 29/74* | (2006.01) | |
| *H01L 29/06* | (2006.01) | |
| *H01L 29/749* | (2006.01) | |
| *H01L 29/78* | (2006.01) | |

(52) U.S. Cl.
CPC ........... *H01L 27/027* (2013.01); *H01L 29/0649* (2013.01); *H01L 29/0834* (2013.01); *H01L 29/1016* (2013.01); *H01L 29/7436* (2013.01); *H01L 29/749* (2013.01); *H01L 29/7835* (2013.01)

USPC .......................................... 257/355; 361/91.5

(58) Field of Classification Search
CPC ............................... H01L 29/772; H01L 23/62
USPC .......................................... 257/355; 361/91.5
See application file for complete search history.

(56) References Cited

U.S. PATENT DOCUMENTS

| | | | | |
|---|---|---|---|---|
| 6,680,493 | B1* | 1/2004 | Wolf et al. ..................... | 257/173 |
| 7,326,998 | B1* | 2/2008 | O et al. ......................... | 257/355 |
| 7,821,070 | B2* | 10/2010 | Jou et al. ....................... | 257/360 |
| 2006/0044714 | A1* | 3/2006 | Chen ............................. | 361/56 |
| 2007/0246767 | A1* | 10/2007 | Osada et al. .................. | 257/314 |
| 2010/0148265 | A1* | 6/2010 | Lin et al. ....................... | 257/355 |
| 2011/0068365 | A1* | 3/2011 | Huang ........................... | 257/173 |

* cited by examiner

*Primary Examiner* — Davienne Monbleau
*Assistant Examiner* — Damon Hillman
(74) *Attorney, Agent, or Firm* — Blakely Sokoloff Taylor & Zafman

(57) ABSTRACT

A device used as an ESD protection structure, which is a modified N-type LDMOS device is disclosed. A conventional LDMOS includes only one N-type heavily doped region as a drain in an N-type lightly doped region (11), while the device of the invention includes a P-type heavily doped region (22) in an N-type lightly doped region (11), dividing the N-type heavily doped region into two N-type heavily doped regions (21, 23) unconnected and independent to each other. The N-type heavily doped region (21) close to the gate (14) has no picking-up terminal. The N-type heavily doped region (23) away from the gate (14) together with the P-type heavily doped region (22) is picked up and connected to an input/output bonding pad.

7 Claims, 4 Drawing Sheets

US 8,981,482 B2

ESD PROTECTION STRUCTURE

CROSS-REFERENCES TO RELATED APPLICATIONS

This application claims the priority of Chinese patent application number 201010290452.X, filed on Sep. 25, 2010, the entire contents of which are incorporated herein by reference.

FIELD OF THE INVENTION

The present invention relates to a semiconductor integrated circuit device and, more particularly, to a MOS transistor used as an ESD protection structure of a high-voltage circuit.

BACKGROUND

Electrostatic discharge (ESD) may cause damage to electronic products and it is difficult to be solved. At present, the most commonly used ESD protection structure for semiconductor integrated circuits is GGMOS (Ground Gate MOSFET). A GGMOS device includes a low-voltage MOS (namely ordinary MOS transistor), an LDMOS (Lateral Diffusion MOSFET) and a DDDMOS (Double Diffusion Drain MOSFET), etc. Wherein, the low-voltage MOS is mainly used as an ESD protection structure for low-voltage circuits, while the LDMOS and DDDMOS are used as ESD protection structures for high-voltage circuits.

Currently, the transistors used as ESD protection structures are mainly N-type MOS transistors. Therefore, the examples of low-voltage MOS, LDMOS and DDDMOS described in the present application are all N-type MOS transistors.

Refer to FIG. 1, which is a schematic diagram showing an existing N-type LDMOS used as an ESD protection structure. Wherein, a P-type well 12 is formed on a P-type substrate 10, and an N-type lightly doped region 11 (i.e. N-type well) is formed in the P-type well 12. Isolation structures 131, 132 are formed in the P-type well 12; an isolation structure 133 is formed in the N-type lightly doped region 11; an isolation structure 134 is formed in the N-type lightly doped region 11 and/or the P-type well 12; the isolation structures 131, 132, 133, and 134 are structures such as LOCOS (Local Oxidation of Silicon) structures or STI (Shallow Trench Isolation) structures. A gate 14 is formed on the P-type well 12, wherein one side of the gate is on the P-type well 12 and the other side is on the isolation structure 133; spacers 15 are formed on both sides of the gate 14; wherein the material of the gate 14 is such as polysilicon, and the material of the spacers 15 is such as silicon nitride. A P-type heavily doped region 161 used as the picking-up terminal of the P-type well 12 is formed between the isolation structures 131 and 132 in the P-type well 12. An N-type heavily doped region 162 used as a source is formed between the isolation structure 132 and one of the spacers 15 of the gate 14 in the P-type well 12. An N-type heavily doped region 163 used as a drain is formed between the isolation structures 133 and 134 and is close to the isolation structure 133 in the N-type lightly doped region 11. And a P-type heavily doped region 164 is formed between the isolation structures 133 and 134 and is close to the isolation structure 134 in the N-type lightly doped region 11. When the LDMOS device is used as an ESD protection structure for a semiconductor integrated circuit, the P-type heavily doped region 161 and the N-type heavily doped region (source) 162 are grounded (i.e. GND), the gate 14 is connected to an interior circuit (or grounded via a resistor), and the N-type heavily doped region (drain) 163 and the P-type heavily doped region 164 are connected to an input/output bonding pad, namely to receive electrostatic charge via the input/output bonding pad.

To simplify, some details such as a gate oxide layer under the gate, pad oxide layer on the side walls and bottom of trenches, and a possible epitaxial layer on the substrate are not described and shown in FIG. 1.

In the LDMOS device shown in FIG. 1, an additional P-type heavily doped region 164 is formed on the side of the drain 163 away from the gate 14 to form a parasitic silicon controlled rectifier to improve the ESD protection capacity thereof.

Refer to FIG. 2 and FIG. 3, when ESD occurs, the parasitic silicon controlled rectifier works as follows:

After positive electrostatic charge enters the LDMOS device shown in FIG. 1 via the input/output bonding pad, the potential of the N-type lightly doped region 11 will rise. And generally, the voltage breakdown occurs at the border of the N-type lightly doped region 11 formed below the channel of the LDMOS device, namely at the early failure point A shown in FIG. 2.

The breakdown current flows through the P-type heavily doped region 161 in the P-type well 12 and increases the potential of the P-type well 12 at the same time, leading to the turn-on of a lateral parasitic transistor shown in FIG. 3.

The lateral parasitic transistor is a NPN transistor composed of the N-type lightly doped region 11, the P-type well 12 below the LDMOS channel and the source 162. When ESD occurs, this lateral parasitic transistor will be turned on for discharging current.

However, as the pervious research finds: after the lateral parasitic transistor is turned on, the current from the drain 163 flows mainly through the N-type lightly doped region 11 below the isolation structure 133 which is partly covered by the gate 14 to the border of the N-type lightly doped region 11 below the entire LDMOS channel and further into the P-type well 12.

Therefore, the potential of the N-type lightly doped region 11 below the P-type heavily doped region 164 is difficult to fall by a value, e.g. 0.7V to turn on the vertical parasitic transistor shown in FIG. 3, which leads to a situation that when the vertical parasitic transistor is turned on, the lateral parasitic transistor has been turned on completely. The vertical parasitic transistor is a PNP transistor composed of the P-type heavily doped region 164, the N-type lightly doped region 11 and the P-type well 12.

The current of the lateral parasitic transistor flows close to the surface of the LDMOS device, and the electric field strength at the border of the drain 163 and the isolation structure 133 is large. Under the influence of the large surface current and electric field strength, the heating power at the intersection point of the surface and the border is large. Therefore, generally, before the vertical parasitic transistor is turned on, damage has occurred at this intersection point shown as the early damage point B in FIG. 2.

Besides, the voltage breakdown may occur on the other side of the N-type lightly doped region 11, that is the side close to the P-type heavily doped region 164, through adjusting the distance C (shown in FIG. 3) between the borders of the P-type heavily doped region 164 and the N-type lightly doped region 11, so that the appearance of the early failure point A may be avoided. However, this adjustment may lead to an unstable avalanche breakdown voltage and therefore forms an unstable electrostatic trigger voltage therefrom.

BRIEF SUMMARY OF THE DISCLOSURE

An objective of the invention is to provide a device used as an ESD protection structure for high voltage circuits, and the electrostatic trigger voltage thereof in ESD is adjustable.

To achieve the above objective, the invention provides a device used as an ESD protection structure, comprising:

a P-type substrate (10);

a P-type well (12), formed in the P-type substrate (10);

an N-type lightly doped region (11), formed in the P-type well (12);

a gate (14), formed on the P-type well (12) and across a border of the N-type lightly doped region (11), covering part of the P-type well (12) and part of the N-type lightly doped region (11);

a source and a drain, respectively formed by a first N-type heavily doped region (162) in the P-type well (12) on one side of the gate and a second N-type heavily doped region (23) in the N-type lightly doped region (11) on the other side of the gate;

a first isolation structure (131), formed in the P-type well and on one side of the source away from the gate;

a first P-type heavily doped region (161), formed between the first isolation structure (131) and the first N-type heavily doped region (162);

a second isolation structure (133), formed in the N-type lightly doped region (11) and under one side of the gate (14);

a third isolation structure (134), partly or entirely formed in the N-type lightly doped region (11) and on one side of the drain away from the gate (14);

a third N-type heavily doped region (21) and a second P-type heavily doped region (22), formed in the N-type lightly doped region (11) and between the second isolation structure (133) and the second N-type heavily doped region (23), wherein the second P-type heavily doped region (22) is formed between the third N-type heavily doped region (21) and the second N-type heavily doped region (23).

In one embodiment of the invention, an electrostatic trigger voltage of the device is adjusted through adjusting a distance between a border of the N-type lightly doped region (11) close to the drain and a border of the drain away from the gate (14).

In one embodiment of the invention, when the device is used as an ESD protection structure for a semiconductor integrated circuit, the first P-type heavily doped region (161) and the first N-type heavily doped region (162) are grounded, the gate (14) is connected to an interior circuit, and the second P-type heavily doped region (22) and the second N-type heavily doped region (23) are connected to an input/output bonding pad.

In one embodiment of the invention, the device used as an ESD protection structure further comprises: a fourth isolation structure (132), formed in the P-type well (12) and between the first P-type heavily doped region (161) and the first N-type heavily doped region (162).

In one embodiment of the invention, the device used as an ESD protection structure further comprises: spacers (15), formed on both sides of the gate (14).

In one embodiment of the invention, the device used as an ESD protection structure further comprises: a fifth isolation structure, formed in the N-type lightly doped region (11) and between the second P-type heavily doped region (22) and the third N-type heavily doped region (21).

In one embodiment of the invention, the device used as an ESD protection structure further comprises: a sixth isolation structure, formed in the N-type lightly doped region (11) and between the second P-type heavily doped region (22) and the second N-type heavily doped region (23).

In one embodiment of the invention, electrostatic voltage breakdown occurs at a border of the N-type lightly doped region (11) away from the gate (14), and electrostatic current flows from the second P-type heavily doped region (22) to the source.

The device used as an ESD protection structure of the present invention can improve the ESD turning-on performance of a parasitic silicon controlled rectifier without affecting the driving function of the device and can further improve the ESD protection performance. Specifically, it can improve the voltage breakdown position when ESD occurs and further improve the device stability in ESD protection. The present invention can also adjust electrostatic trigger voltage through parameters setting, rapidly turn on a vertical parasitic transistor, and reduce the damage of voltage breakdown to the channel region of the device and hence the risk of failure to turn-on the vertical parasitic transistor.

BRIEF DESCRIPTION OF THE DRAWINGS

The present invention is further detailed by embodiments in combination with the following drawings.

DETAILED DESCRIPTION

Figure 1:
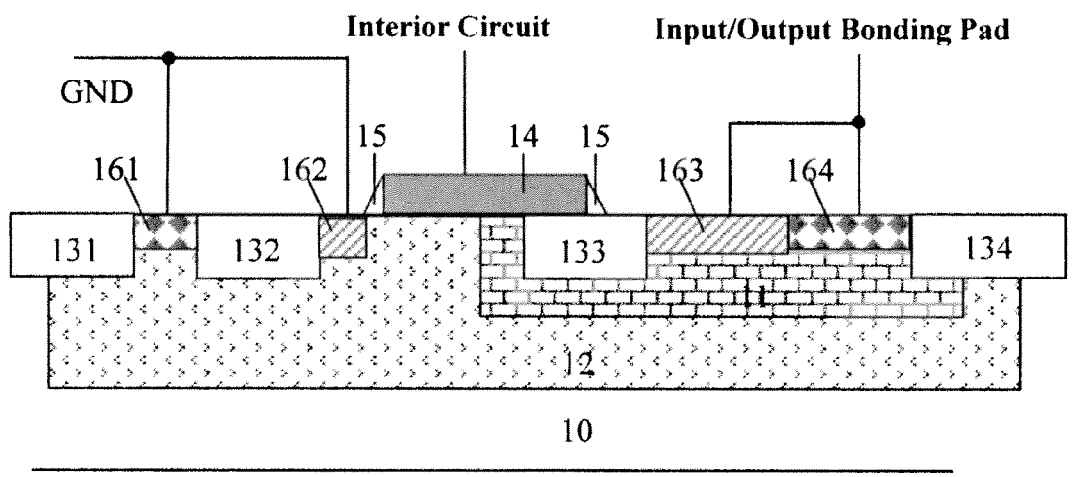
FIG. 1 is a schematic diagram showing the structure of an existing N-type LDMOS used as an ESD protection structure.
Figure 2:
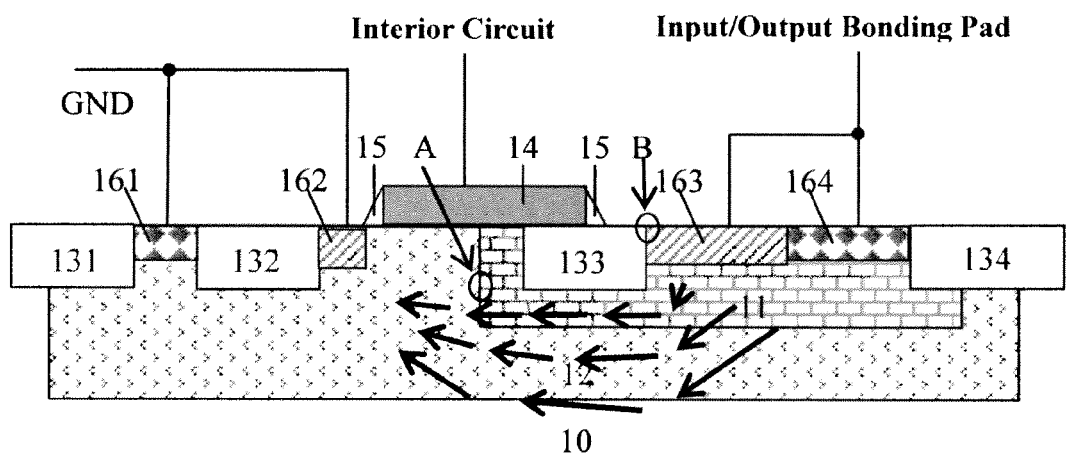
FIG. 2 is a schematic diagram showing the principle of the device shown in FIG. 1.
Figure 3:
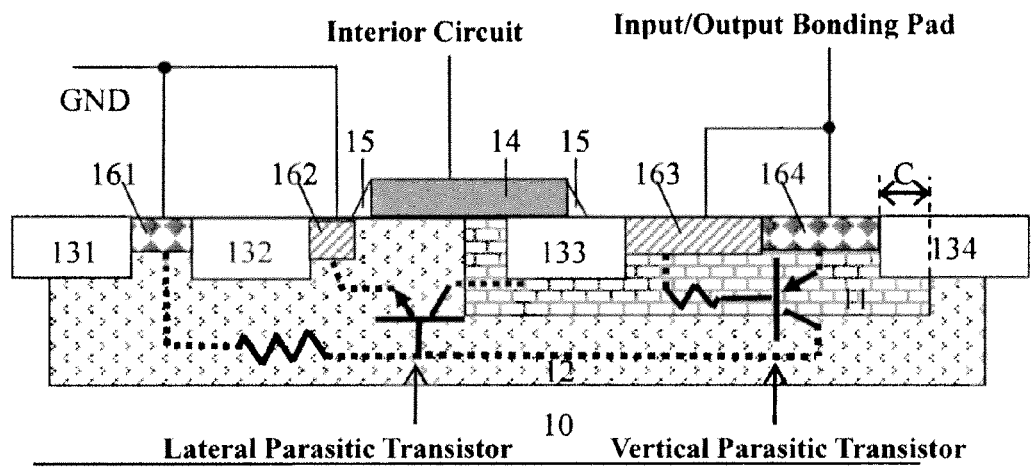
FIG. 3 is a schematic diagram showing the lateral parasitic transistor and the vertical parasitic transistor shown in FIG. 1.
Figure 4:
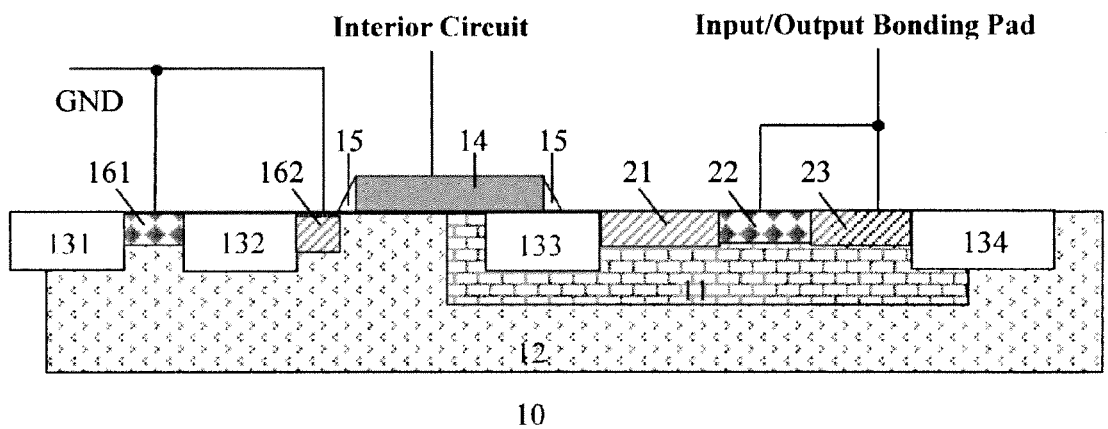
FIG. 4 is a schematic diagram showing the device used as an ESD protection structure in an embodiment of the present invention.

As shown in FIG. 4, the device of the present invention used as an ESD protection structure is also an N-type LDMOS device. The device includes a P-type substrate 10, a P-type well 12 in the P-type substrate 10, and a N-type lightly doped region 11 in the P-type well 12. Isolation structures 131, 132 are formed in the P-type well 12, an isolation structure 133 is formed in the N-type lightly doped region 11, and an isolation structure 134 is formed in the N-type lightly doped region 11 and/or the P-type well 12, wherein the isolation structures 131, 132, 133, and 134 are structures such as LOCOS (Local Oxidation of Silicon) structures or STI (Shallow Trench Isolation) structures. A gate 14 is formed on the P-type well 12, wherein one side of the gate is on the P-type well 12 and the other side is on the isolation structure 133, and spacers 15 are formed on both sides of the gate 14. Wherein, the material of the gate 14 is such as polysilicon, and the material of the spacers 15 is such as silicon nitride. A P-type heavily doped region 161, as the picking-up terminal of the P-type well 12, is formed between the isolation structures 131 and 132 in the P-type well 12. A N-type heavily doped region 162 as a source, is formed between the isolation structure 132 and one of the spacers 15 of the gate 14 in the P-type well 12. A N-type heavily doped region 21 is formed between the isolation structures 133 and 134 and close to the isolation structure 133 in the N-type lightly doped region 11. A N-type heavily doped region 23 as a drain, is formed between the isolation structures 133 and 134 and close to the isolation structure 134 in the N-type lightly doped region 11. And a P-type heavily doped region 22 is formed between the N-type heavily doped region 21 and the N-type heavily doped region 23 in the N-type lightly doped region 11. When the LDMOS device is used as an ESD protection structure for a semiconductor integrated circuit, the P-type heavily doped region 161 and the N-type heavily doped region (source) 162 are grounded, the gate 14 is connected to an interior circuit (or grounded via a resistor, in this case, the device only has an EDS protection function rather than an output driving function), and the P-type heavily doped region 22 and the N-type heavily doped region (drain) 23 are connected to an input/output bonding pad, receiving electrostatic charge via the input/output bonding pad.

The device of the present invention used as an ESD protection structure is a modified N-type LDMOS device, and the modifications are embodied as follows: an unmodified N-type LDMOS device includes only one N-type heavily doped region as a drain in a N-type lightly doped region 11. While the device of the present invention includes a P-type heavily doped region 22 in the N-type lightly doped region 11, dividing a N-type heavily doped region into two N-type heavily doped regions 21, 23 unconnected and independent to each other. Wherein the N-type heavily doped region 21 close to the gate 14 have no picking-up terminal, while the N-type heavily doped region 23 away from the gate 14 is picked up together with the P-type heavily doped region 22 and connected to an input/output bonding pad.

In the device shown in FIG. 4, it is also practicable to arrange isolation structures (not shown in the figure) between two of the N-type heavily doped region 21, the P-type heavily doped region 22 and the N-type heavily doped region 23. And it is also practicable to delete the isolation structure 132 between the P-type heavily doped region 161 and the source 162.

Figure 5:
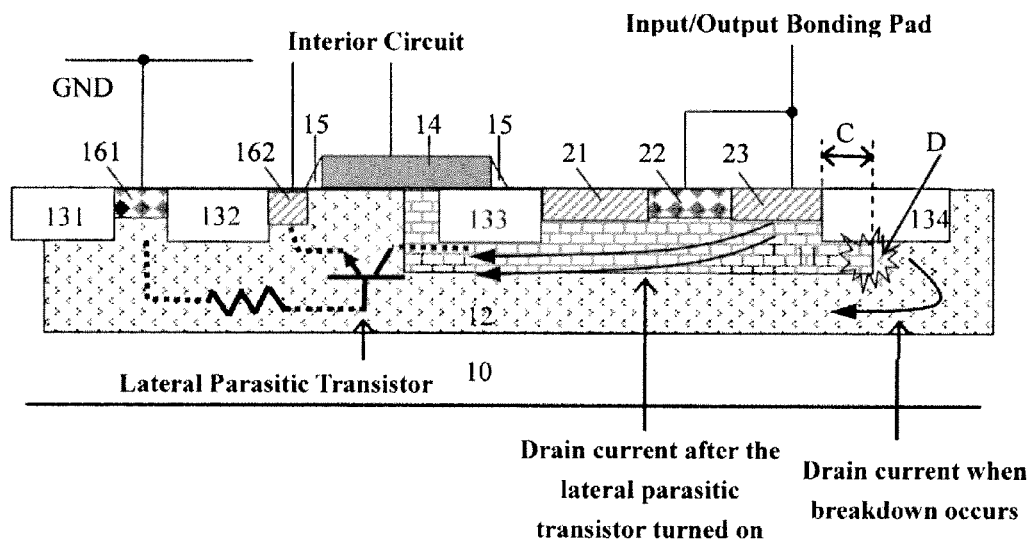
FIG. 5 is a schematic diagram showing the principle of the device shown in FIG. 4.
Figure 6:
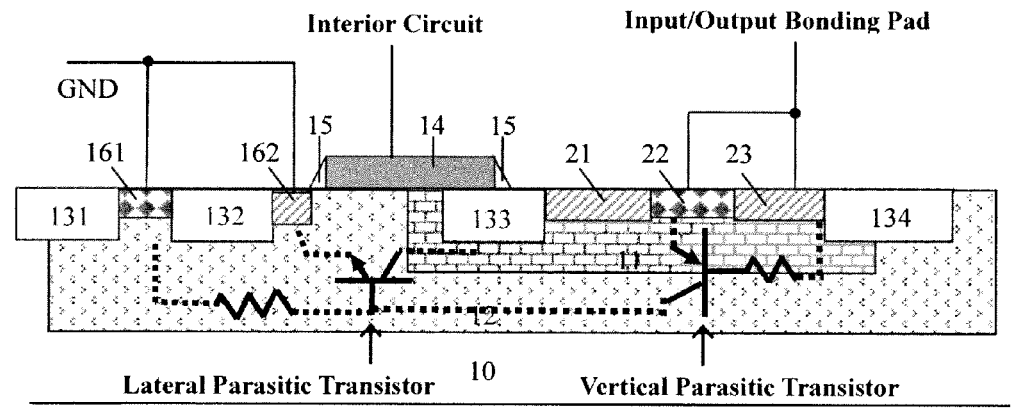
FIG. 6 is a schematic diagram showing the lateral parasitic transistor and the vertical parasitic transistor shown in FIG. 4.

As shown in FIG. 5 and FIG. 6, when ESD occurs, the device of the present invention (N-type LDMOS device) used as an ESD protection structure works as follows:

After positive electrostatic charge entering the N-type heavily doped region (drain) 23 via the input/output bonding pad, the potential of the drain 23 and the N-type lightly doped region 11 will rise. Through adjusting the distance C between the borders of the N-type lightly doped region 11 and the drain 23, the breakdown voltage to the P-type well 12 of the position D shown in FIG. 5 is adjusted lower than that of other positions in the N-type lightly doped region 11, therefore position D is the voltage breakdown position. The breakdown current flows through and out of the P-type well 12 via the P-type heavily doped region 161 as the picking-up terminal of the P-type well 12, and meanwhile increases the potential of the P-type well 12. When the potential of the P-type well 12 is increased to a value, e.g. 0.7V, the lateral parasitic transistor shown in FIG. 5 will be turned on to discharge the electrostatic current. The lateral parasitic transistor is a NPN transistor composed of the N-type lightly doped region 11, the P-type well 12 formed below the LDMOS channel and the source 162.

After the lateral parasitic transistor is turned on, the electrostatic current from the drain 23 mainly flows via the N-type lightly doped region 11 below the P-type heavily doped region 22 into the P-type well 12 through the border of the N-type lightly doped region 11 below the LDMOS channel, and meanwhile, reducing the potential of the region below the P-type heavily doped region 22. When the potential of the N-type lightly doped region 11 below the P-type heavily doped region 22 falls lower than that of the drain 23, e.g. 0.7V, the vertical parasitic transistor shown in FIG. 6 will be turned on and forms an turned-on silicon controlled rectifier together with the lateral parasitic transistor turned on previously to discharge the electrostatic current. The vertical parasitic transistor is a PNP transistor composed of the P-type well 12, the N-type lightly doped region 11 and the P-type heavily doped region 22.

Figure 7:
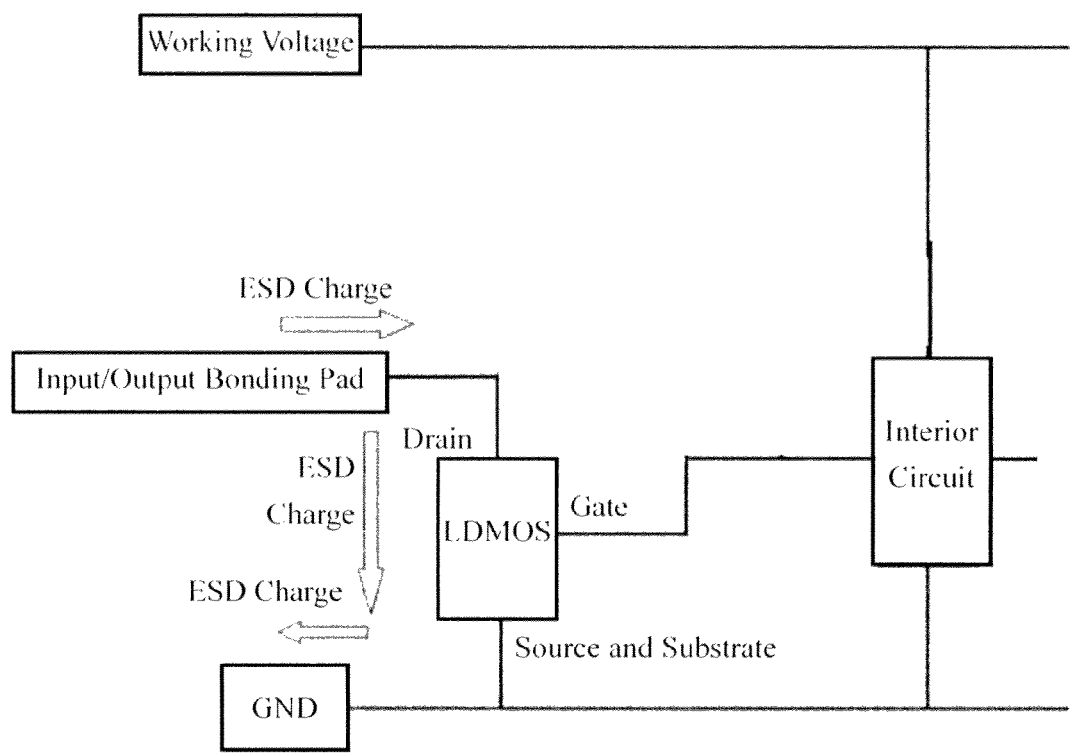
FIG. 7 is a schematic diagram showing an application of the device of an embodiment of the present invention in an electric circuit.

FIG. 7 shows a connection method of the device of the present invention in a circuit. According to FIG. 4, the source 162 and the P-type heavily doped region 161 (picking-up terminal of the substrate) are grounded, the gate 14 is connected to an interior circuit, and the P-type heavily doped region 22 and the drain 23 are connected to an input/output bonding pad. In a normal working mode of the circuit, the device of the present invention can be used as an output module for providing a driving function. And when electrostatic generated, it can provide an ESD path to ensure that the device with the driving function and the interior circuit will not be damaged by electrostatic.

The major advantages of the device of the present invention used as an ESD protection structure are as follows:

First, the ESD trigger voltage can be adjusted according to design. Because the breakdown voltage of the N-type lightly doped region 11 can be adjusted by changing the distance C between the border of the drain 23 away from the gate 14 and the border of the N-type lightly doped region 11 away from the gate 14.

Second, the voltage breakdown position D shown in FIG. 5 is away from the LDMOS device channel, which reduce the damage to the LDMOS device channel region and the gate oxide layer during the voltage breakdown process, and therefore improve the stability of ESD protection.

Third, when the lateral parasitic transistor shown in FIG. 5 is turned on, the current mainly flows via the N-type lightly doped region 11 below the P-type heavily doped region 22, which is beneficial to turning on the vertical parasitic transistor, and improving the ESD capability.

Fourth, the structure of the functional regions of the LDMOS device is not changed and therefore the driving function of the device is less affected.

Fifth, the existence of the N-type heavily doped region 21 close to the gate 14 in the N-type lightly doped region 11 makes the LDMOS device have a current path more similar to that of a LDMOS device without a parasitic silicon controlled rectifier during normal operation, which helps the ESD current in the silicon controlled rectifier to flow deeply into the LDMOS device, and decreasing the damage to the structure of the LDMOS device by the surface current of the turned-on lateral parasitic transistor.

In a word, the device of the present invention used as an ESD protection structure has a good ESD protection performance and improves the stability of the device in ESD protection.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A device used as an ESD protection structure, comprising: a P-type substrate (10); a P-type well (12), formed in the P-type substrate (10); a gate (14), formed on the P-type well (12); an N-type lightly doped region (11) formed in the P-type well (12), the N-type lightly doped region (11) having a first end under the gate (14); a source and a drain, respectively formed by a first N-type heavily doped region (162) in the P-type well (12) at a first end of the gate and a second N-type heavily doped region (23) in the N-type lightly doped region (11) between a second end of the gate and a second end of the N-type lightly doped region (11); a first isolation structure (131), formed in the P-type well (12) and on one side of the source away from the gate; a first P-type heavily doped region (161), formed between the first isolation structure (131) and the first N-type heavily doped region (162); a second isolation structure (133), formed in the N-type lightly doped region (11) and under the second end of the gate (14); a third isolation structure (134), partly or entirely formed in the N-type lightly doped region (11) and on one side of the drain away from the gate (14); a third N-type heavily doped region (21) and a second P-type heavily doped region (22), formed in the N-type lightly doped region (11) and between the second end of the gate and the drain, wherein the second P-type heavily doped region (22) is formed between the third N-type heavily doped region (21) and the drain, and the first P-type heavily doped region (161) and the first N-type heavily doped region (162) are grounded, the gate (14) is connected to an interior circuit, and the second P-type heavily doped region (22) and the second N-type heavily doped region (23) are connected to an input/output bonding pad.

2. The device used as an ESD protection structure according o claim 1, an electrostatic trigger voltage of which is adjusted through adjusting a distance between a border of the N-type lightly doped region (11) close to the drain and a border of the drain away from the gate (14).

3. The device used as an ESD protection structure according claim 1, further comprising:
a fourth isolation structure (132), formed in the P-type well (12) and between the first P-type heavily doped region (161) and the first N-type heavily doped region (162).

4. The device used as an ESD protection structure according to claim 1, further comprising:
spacers (15), formed on both sides of the gate (14).

5. The device used as an ESD protection structure according to claim 1, further comprising:
a fifth isolation structure, formed in the N-type lightly doped region (11) and between he second P-type heavily doped region (22) and the third N-type heavily doped region (21).

6. The device used as an ESD protection structure according to claim 1, further comprising:
a sixth isolation structure, formed in the N-type lightly doped region (11) and between the second P-type heavily doped region (22) and the second N-type heavily doped region (23).

7. The device used as an ESD protection structure according to claim 1, wherein. electrostatic voltage breakdown occurs at a border of the N-type lightly doped region (11) away from the gate (14), and electrostatic current flows from the second P-type heavily doped region (22) to the source.

* * * * *